United States Patent
Chang

(10) Patent No.: US 11,324,140 B2
(45) Date of Patent: May 3, 2022

(54) COMPOSITE HEAT DISSIPATING STRUCTURE AND ELECTRONIC DEVICE USING THE SAME

(71) Applicant: Chiun Mai Communication Systems, Inc., New Taipei (TW)

(72) Inventor: Yu-Wei Chang, New Taipei (TW)

(73) Assignee: Chiun Mai Communication Systems, Inc., New Taipei (TW)

(*) Notice: Subject to any disclaimer, the term of this patent is extended or adjusted under 35 U.S.C. 154(b) by 0 days.

(21) Appl. No.: 17/032,287

(22) Filed: Sep. 25, 2020

(65) Prior Publication Data

US 2021/0092870 A1 Mar. 25, 2021

(30) Foreign Application Priority Data

Sep. 25, 2019 (CN) .......................... 201910914075.3

(51) Int. Cl.
| | |
|---|---|
| H05K 7/20 | (2006.01) |
| F28D 15/02 | (2006.01) |
| F28D 15/04 | (2006.01) |
| F28F 3/12 | (2006.01) |
| G06F 1/20 | (2006.01) |

(52) U.S. Cl.
CPC ..... *H05K 7/20336* (2013.01); *F28D 15/0233* (2013.01); *F28D 15/046* (2013.01); *F28F 3/12* (2013.01); *G06F 1/203* (2013.01); *H05K 7/2029* (2013.01)

(58) Field of Classification Search
CPC .... H05K 7/2029; H05K 7/20336; G06F 1/20; G06F 1/203; H01L 23/427; H01L 23/473; F28D 15/0233; F28D 15/0275; F28D 15/04; F28F 1/006; F28F 1/26; F28F 1/30
See application file for complete search history.

(56) References Cited

U.S. PATENT DOCUMENTS

| | | | | |
|---|---|---|---|---|
| 8,919,427 | B2* | 12/2014 | Wang | F28D 15/046 165/104.26 |
| 9,046,305 | B2* | 6/2015 | Chen | F28D 15/0233 |
| 9,721,869 | B2* | 8/2017 | Sun | F28D 15/0233 |
| 2012/0012281 | A1* | 1/2012 | Franz | H01L 23/427 165/104.26 |
| 2017/0122671 | A1* | 5/2017 | Lin | F28F 3/048 |
| 2017/0303433 | A1* | 10/2017 | Delano | G06F 1/20 |

FOREIGN PATENT DOCUMENTS

| | | |
|---|---|---|
| CN | 101578029 A | 11/2009 |
| CN | 103079381 A | 5/2013 |
| TW | 201414977 A | 4/2014 |

* cited by examiner

*Primary Examiner* — Zachary Pape
(74) *Attorney, Agent, or Firm* — ScienBiziP, P.C.

(57) ABSTRACT

A thin-profile composite heat dissipating structure for a heat-generating electronic device includes a heat sink and a heat pipe, the heat sink includes a first housing, a first heat dissipation liquid, and a gas. The first housing is sealed to form a first cavity, the first heat dissipation liquid and the gas are received in the first cavity. The heat pipe is connected to the first housing and a wick structure to allow the return of the condensed heat dissipation liquid by capillary action is disposed elsewhere. An electronic device using the structure is also provided.

8 Claims, 5 Drawing Sheets

COMPOSITE HEAT DISSIPATING STRUCTURE AND ELECTRONIC DEVICE USING THE SAME

FIELD

The disclosure generally relates to temperature control, of a composite heat dissipating structure and an electronic device using the same.

BACKGROUND

VC (Vapor-Chamber) is widely used in electronic equipment for heat dissipation. The VC may have a wick structure and working liquid disposed in a chamber of the VC. However, the wick structure may occupy most of the space in the chamber, which decreases the amount of the working liquid in the chamber and also increases the thickness of the VC. Furthermore, the heat dissipation of the VC is not uniform.

BRIEF DESCRIPTION OF THE FIGURES

Implementations of the present disclosure will now be described, by way of example only, with reference to the attached figures.

DETAILED DESCRIPTION

Figure 1:
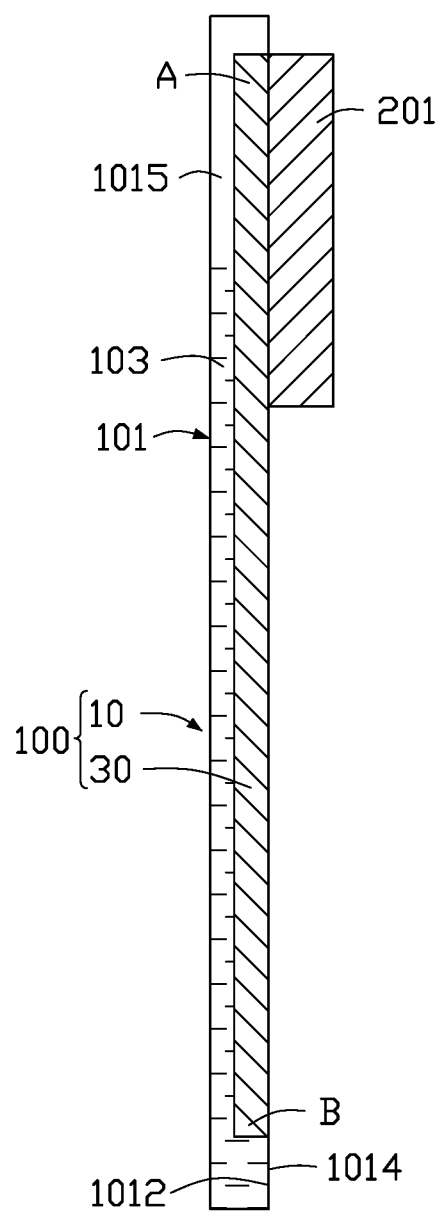
FIG. 1 is a cross-sectional view of an embodiment of a composite heat dissipating structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiment described herein can be practiced without these specific details. In other instances, methods, procedures, and components have not been described in detail so as not to obscure the related relevant feature being described. Further, the description is not to be considered as limiting the scope of the embodiments described herein. The drawings are not necessarily to scale and the proportions of certain parts may be exaggerated to better illustrate details and features of the present disclosure.

The term "comprising" when utilized, means "including, but is not limited thereto"; it specifically indicates open-ended inclusion or membership in the so-described combination, group, series, and the like. The term "coupled" when utilized, means a direct connection between the things that are connected, or an indirect connection through one or more passive or active intermediary devices, but is not limited thereto".

Figure 2:
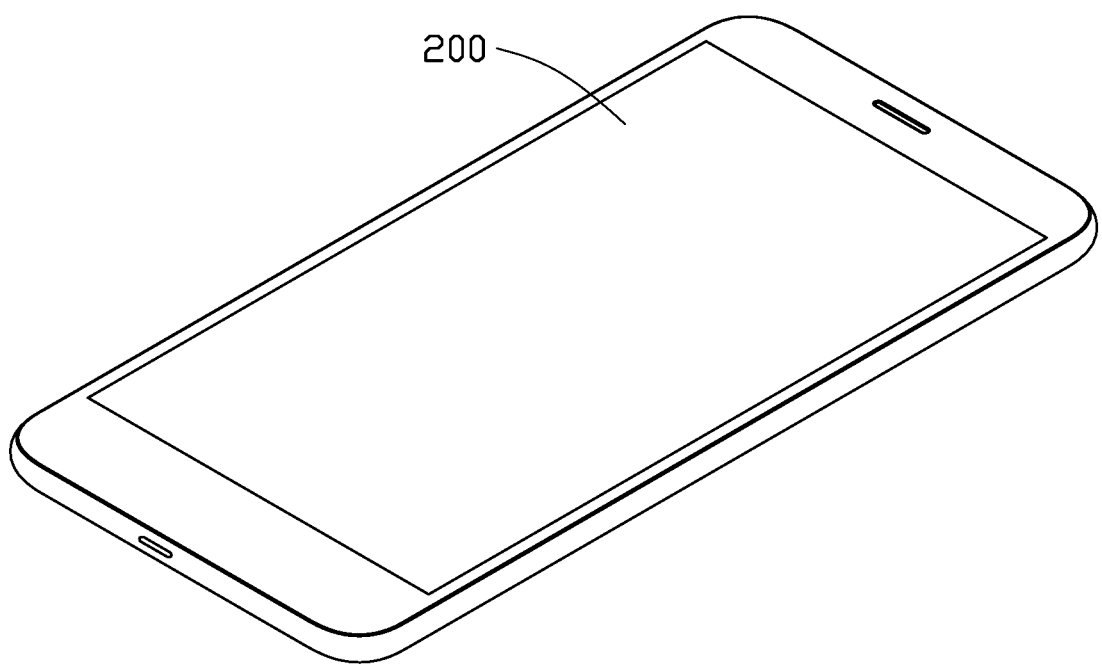
FIG. 2 is a perspective view of an embodiment of an electronic device.

FIG. 1 illustrates an embodiment of a composite heat dissipating structure 100. The composite heat dissipating structure 100 can be applied to an electronic device 200 (shown in FIG. 2), such as a mobile phone, a tablet computer, a watch, or the like. The composite heat dissipating structure 100 dissipates heat generated by heating elements 201 in the electronic device 200. The heating elements 201 may be, but are not limited to, batteries and electronic chips. Referring to FIG. 2, the electronic device 200 is a mobile phone.

The composite heat dissipating structure 100 includes a heat sink 10 and a heat pipe 30.

The heat sink 10 includes a first housing 101 and a first heat dissipation liquid 103.

Figure 3:
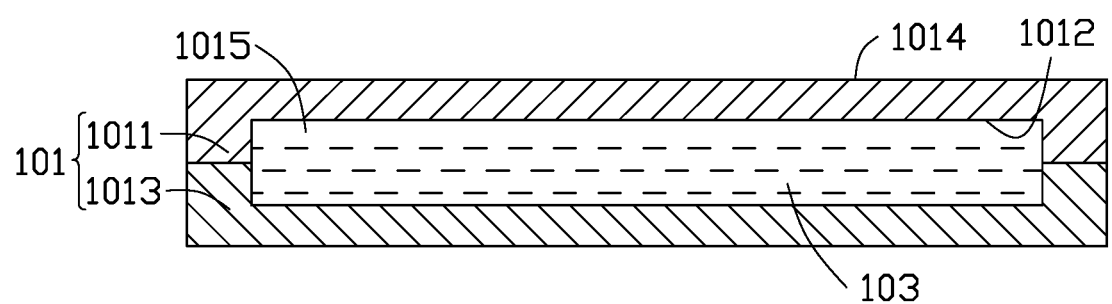
FIG. 3 is a cross-sectional view of a heat sink of the composite heat dissipating structure in FIG. 1.

Referring to FIG. 3, the first housing 101 includes an upper housing 1011 and a lower housing 1013. The upper housing 1011 and the lower housing 1013 are engaged with each other to form a first cavity 1015. The first heat dissipation liquid 103 is received in the first cavity 1015. The first housing 101 may be made of a metal material, a non-metal material, or a composite material of metal and non-metal. The metal material may be, but is not limited to, aluminum alloy, stainless steel, titanium alloy, and magnesium alloy. The non-metal material may be, but is not limited to, PC (polycarbonate), PA (polyamide), PBT (polybutylene terephthalate), PPS (polyphenylene sulfide), and PEEK (polyether ether ketone).

In one embodiment, a liquid solution having a boiling point lower than an operating temperature of the heating element 201 is selected as the first heat dissipation liquid 103 of the heat sink 10. Thus, the first heat dissipation liquid 103 can be converted between a gaseous phase and a liquid phase at the operating temperature of the heating element 201, even when not in a vacuum environment. The first heat dissipation liquid 103 may be an electron liquid.

In at least one embodiment, the first heat dissipation liquid 103 is in a non-vacuum environment. In addition to the first heat dissipation liquid 103, the first cavity 1015 also has gas (such as air) therein.

Figure 4:
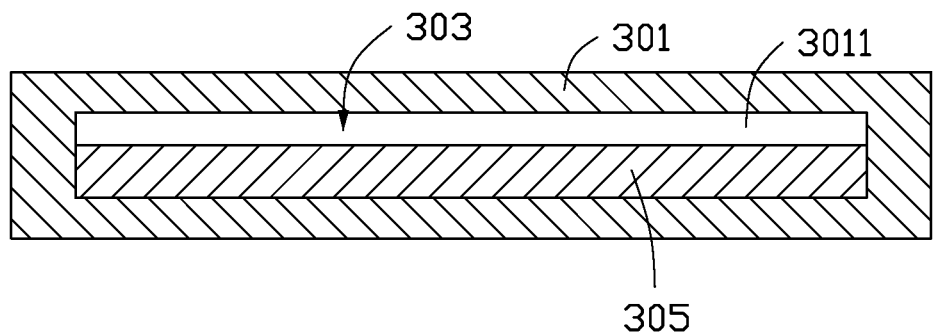
FIG. 4 is a cross-sectional view of a heat pipe of the composite heat dissipating structure in FIG. 1.

Referring to FIG. 4, the heat pipe 30 includes a second housing 301, a second heat dissipation liquid 303, and a wick structure 305. The second housing 301 is sealed to form a second cavity 3011. The second heat dissipation liquid 303 and the wick structure 305 are received in the second cavity 3011. The wick structure 305 guides the second heat dissipation liquid 303 in liquid phase to flow in the second cavity 3011 by capillary action. The wick structure 305 may be, but is not limited to, a foam and a copper mesh. In at least one embodiment, the second housing 301 is made of the metal material.

In at least one embodiment, the heat pipe 30 is connected to the upper housing 1011. When the upper housing 1011 is made of the metal material, the second housing 301 of the heat pipe 30 and the upper housing 1011 can be integrally formed. When the upper housing 1011 is made of the non-metal material, the second housing 301 of the heat pipe 30 may be connected to the upper housing 1011 by an insert molding process. The lower housing 1013 may be made of the metal material or the non-metal material according to need.

In other embodiments, the second housing 301 and the lower housing 1013 can also be integrally formed or connected together by the insert molding process, according to the material of the lower housing 1013.

The heat pipe 30 is disposed on at least one surface of the upper housing 1011 and the lower housing 1013. In the embodiment, the heat pipe 30 is disposed on one surface of the upper housing 1011.

Referring to FIG. 3, the upper housing 1011 includes an inner surface 1012 and an outer surface 1014 opposite the inner surface 1012. The inner surface 1012 faces the lower housing 1013, and the outer surface 1014 faces away from the lower housing 1013.

In the embodiment, an operating principle of the composite heat dissipating structure 100 is as follows when the heat pipe 30 is disposed on the inner surface 1012 or the outer surface 1014.

The heat pipe 30 includes a first end A and a second end B. The first end A and the second end B are respectively located at opposite ends of the heat pipe 30. The first end A may be either an evaporating end or a condensation end of the heat pipe 30, the second end B is the reverse end.

Embodiment 1

Referring to FIG. 1, the heat pipe 30 is disposed on the inner surface 1012 of the upper housing 1011. The first end A of the heat pipe 30 is in contact with the gas in the first cavity 1015. The second end B is in contact with the first heat dissipation liquid 103. The heating element 201 is disposed on the outer surface 1014 of the upper housing 1011 and corresponds to the first end A of the heat pipe 30. When the electronic device 200 is in operation, the heat generated by the heating element 201 is transferred to the first end A of the heat pipe 30 through the upper housing 1011. Then, the second heat dissipation liquid 303 in liquid phase at the first end A absorbs the heat and is vaporized into the second heat dissipation liquid 303 in gaseous phase. Thus, the volume of the second heat dissipation liquid 303 expands quickly to fill the second cavity 3011 entirely, thereby dissipating the heat to the second end B. Since the second end B contacts the first heat dissipation liquid 103, the heat is transferred to the first heat dissipation liquid 103 through the second end B. Thus, the first heat dissipation liquid 103 in a liquid phase at the second end B absorbs heat and is vaporized into first heat dissipation liquid 103 in a gaseous phase. The volume of the first heat dissipation liquid 103 expands quickly to fill the first cavity 1015 entirely. When the first heat dissipation liquid 103 in gaseous phase contacts the lower temperature zone of the first cavity 1015, the gaseous first heat dissipation liquid 103 is condensed into the liquid-phase first heat dissipation liquid 103. In this way, the first heat dissipation liquid 103 converts between the gaseous phase and the liquid phase, which dissipates the heat from the heating element 201. In addition, when the second end B transfers the heat to the first heat dissipation liquid 103, the second heat dissipation liquid 303 in the gaseous phase in the heat pipe 30 comes into contact with the lower temperature zone of the second end B, the second heat dissipation liquid 303 in the gaseous phase is condensed into the second heat dissipation liquid 303 in the liquid phase. Then, the second heat dissipation liquid 303 in the liquid phase is absorbed by the wick structure 305 at the second end B and returns to the first end A through the capillary action of the wick structure 305. In this way, the second heat dissipation liquid 303 is converted between the gaseous phase and the liquid phase, and transfers heat from the first end A to the second end B while doing so. The heat pipe 30 also assist the heating element 201 to dissipate the heat dissipation. In Embodiment 1, the first end A is the evaporating end of the heat pipe 30, and the second end B is the condensing end of the heat pipe 30.

Embodiment 2

Figure 5:
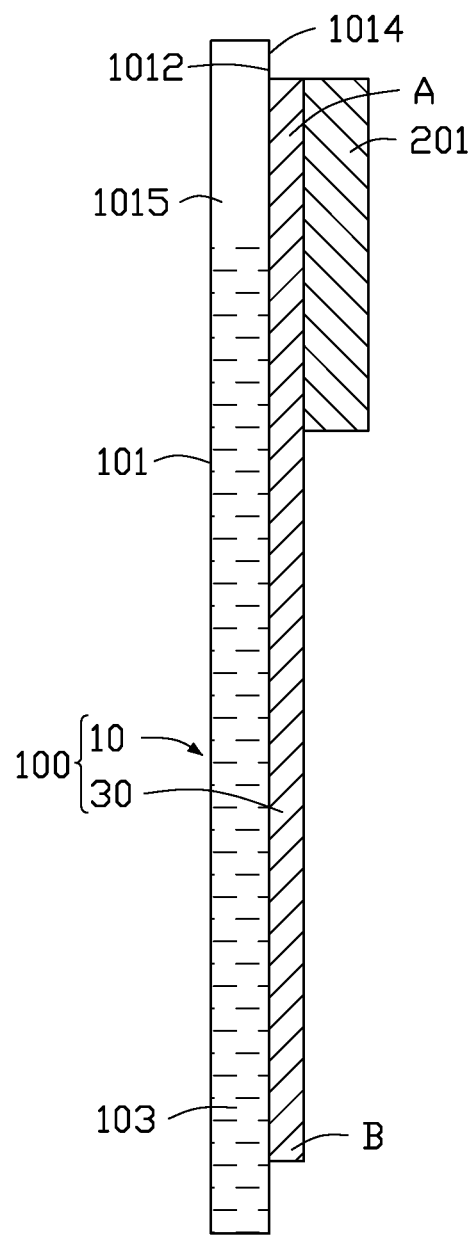
FIG. 5 is a cross-sectional view of another embodiment of a composite heat dissipating structure.

Referring to FIG. 5, the heat pipe 30 is disposed on the outer surface 1014 of the upper housing 1011. The heating element 201 is disposed on the first end A of the heat pipe 30. When the electronic device 200 is in operation, the heat generated by the heating element 201 is absorbed by the second heat dissipation liquid 303 at the first end A which is in contact with the heating element 201. The heat being absorbed vaporizes the second heat dissipation liquid 303, so expanding the volume of the second heat dissipation liquid 303 to fill the second cavity 3011 entirely, thereby dissipating the heat to the second end B. Then, the second end B transfers heat to the first heat dissipation liquid 103 through the upper housing 1011. The first heat dissipation liquid 103 absorbs heat and is vaporized into the first heat dissipation liquid 103 in gaseous phase, and the volume of the first heat dissipation liquid 103 expands quickly to fill the first cavity 1015 entirely. When the first heat dissipation liquid 103 in gaseous phase comes into contact with the lower temperature zone of the first cavity 1015, the gaseous first heat dissipation liquid 103 is condensed into the liquid-phase first heat dissipation liquid 103. In this way, heat from the heating element 201 is gathered by the first heat dissipation liquid 103 converting between the gaseous phase and the liquid phase. In addition, while the second end B transfers the heat to the first heat dissipation liquid 103, the second heat dissipation liquid 303 in the gaseous phase in the heat pipe 30 comes into contact with the lower temperature zone of the second end B, the second heat dissipation liquid 303 in the gaseous phase is condensed into liquid form. Then, the second heat dissipation liquid 303 in the liquid phase is absorbed by the wick structure 305 at the second end B and is returned to the first end A through capillary action of the wick structure 305. In this way, the second heat dissipation liquid 303 can convert between the gaseous phase and the liquid phase, which transfers heat from the first end A to the second end B. The heat pipe 30 also assists the heating element 201 to dissipate the heat. In Embodiment 1, the first end A is the evaporating end of the heat pipe 30, and the second end B is the condensing end of the heat pipe 30.

The heat pipe 30 is connected to the heat sink 10 and achieves the composite heat dissipating structure 100 with uniform heat dissipation. Compared to an existing heat sink not having a wick structure, the heat sink 10 provides a larger space for the liquid-gas-liquid circulation of the first heat dissipation liquid 103 in the first cavity 1015. Since there is no wick structure in the heat sink 10, more first heat dissipation liquid 103 can be contained in the first cavity 1015, thereby improving the gathering and dissipation of heat by the composite heat dissipating structure 100. The heat sink 10 having no wick structure also reduces the thickness of the composite heat dissipating structure 100, thus the heat sink 10 can be applied in light and thin electronic devices. In addition, the heat pipe 30 increases the temperature difference between the two ends of the heat sink 10, thereby improving the heat dissipation efficiency of the composite heat dissipating structure 100.

It is to be understood, however, that even though numerous characteristics and advantages of the present disclosure have been set forth in the foregoing description, together with details of assembly and function, the disclosure is illustrative only, and changes may be made in details, especially in the matters of shape, size, and arrangement of parts within the principles of the disclosure to the full extent indicated by the broad general meaning of the terms in which the appended claims are expressed.

What is claimed is:
1. A composite heat dissipating structure, comprising:
a heat sink comprising:

a first housing comprising an upper housing and a lower housing, the upper housing and the lower housing being sealed to form a first cavity, the upper housing comprising an inner surface and an outer surface opposite to the inner surface, the inner surface facing the lower housing, and the outer surface being away from the lower housing;

a first heat dissipation liquid received in the first cavity; and a gas received in the first cavity; and a heat pipe disposed on the inner surface and comprising a first end and a second end opposite to the first end, the first end being one of an evaporating end and a condensation end of the heat pipe, the second end being the other one of the evaporating end and the condensation end, the first end contacting the gas received in the first cavity, and the second end contacting the first heat dissipation liquid received in the first cavity.

2. The composite heat dissipating structure of claim 1, wherein the heat pipe comprises a second housing connected to the upper housing, each of the second housing and the upper housing is made of a metal material, the lower housing is made of a non-metal material, and the second housing and the upper housing are integrally formed.

3. The composite heat dissipating structure of claim 2, wherein the heat pipe comprises a second heat dissipation liquid and a wick structure, the second housing defines a second cavity, and the second heat dissipation liquid and the wick structure are received in the second cavity.

4. The composite heat dissipating structure of claim 1, wherein the first housing is made of a metal material, a non-metal material, or a composite material of metal and non-metal.

5. An electronic device comprising:
a composite heat dissipating structure comprising:
a heat sink comprising:
a first housing comprising an upper housing and a lower housing, the upper housing and the lower housing being sealed to form a first cavity, the upper housing comprising an inner surface and an outer surface opposite to the inner surface, the inner surface facing the lower housing, and the outer surface being away from the lower housing;

a first heat dissipation liquid received in the first cavity; and a gas received in the first cavity; and a heat pipe disposed on the inner surface and comprising a first end and a second end opposite to the first end, the first end being one of an evaporating end and a condensation end of the heat pipe, the second end being the other one of the evaporating end and the condensation end, the first end contacting the gas received in the first cavity, and the second end contacting the first heat dissipation liquid received in the first cavity.

6. The electronic device of claim 5, wherein the heat pipe comprises a second housing connected to the upper housing, each of the second housing and the upper housing is made of a metal material, the lower housing is made of a non-metal material, and the second housing and the upper housing are integrally formed.

7. The electronic device of claim 6, wherein the heat pipe comprises a second heat dissipation liquid and a wick structure, the second housing defines a second cavity, and the second heat dissipation liquid and the wick structure are received in the second cavity.

8. The electronic device of claim 5, wherein the first housing is made of a metal material, a non-metal material, or a composite material of metal and non-metal.

* * * * *